United States Patent [19]
Carlsson

[11] Patent Number: 5,304,947
[45] Date of Patent: Apr. 19, 1994

[54] ARRANGEMENT FOR ELIMINATING OFFSET ERRORS IN A POWER CONTROL CIRCUIT OF A PULSED TRANSMITTER FINAL AMPLIFIER

[75] Inventor: John T. Carlsson, Lund, Sweden

[73] Assignee: Ericsson Ge Mobile Communications, Inc., Research Triangle, N.C.

[21] Appl. No.: 30,725

[22] Filed: Mar. 12, 1993

[30] Foreign Application Priority Data

Mar. 17, 1992 [SE] Sweden .............................. 9200819-2

[51] Int. Cl.$^5$ .............................................. H03G 3/30
[52] U.S. Cl. .................................. 330/279; 330/280; 330/281; 455/126
[58] Field of Search .............. 330/129, 138, 141, 279, 330/280, 281; 455/116, 127, 126; 375/60, 71, 98

[56] References Cited

U.S. PATENT DOCUMENTS

4,523,155  6/1985  Walczak et al. .
5,196,806  3/1993  Ichihara .......................... 330/279 X

FOREIGN PATENT DOCUMENTS

0403247  12/1990  European Pat. Off. .
58-51609   3/1983  Japan .
58-200614 11/1983  Japan .

*Primary Examiner*—James B. Mullins
*Attorney, Agent, or Firm*—Burns, Doane, Swecker & Mathis

[57] ABSTRACT

A high frequency power amplifier amplifies periodic signals in the form of HF bursts. The power output of the amplifier is adjusted by a control loop which produces a control signal in response to a comparison made between a set-point value (BV) and the actual power output (Put) of the amplifier and applies the signal to the power amplifier. The control loop includes a differential amplifier. A correction circuit measures the output voltage of the differential amplifier over a time period ($t_1$ to $t_2$) prior to each HF burst and stores in a memory (C) a magnitude proportional to this output voltage. During the following HF burst, this magnitude is used to introduce into the control loop a correction magnitude (Ukorr) for correction of offset voltages (Uoff) occurring in the control loop.

3 Claims, 3 Drawing Sheets

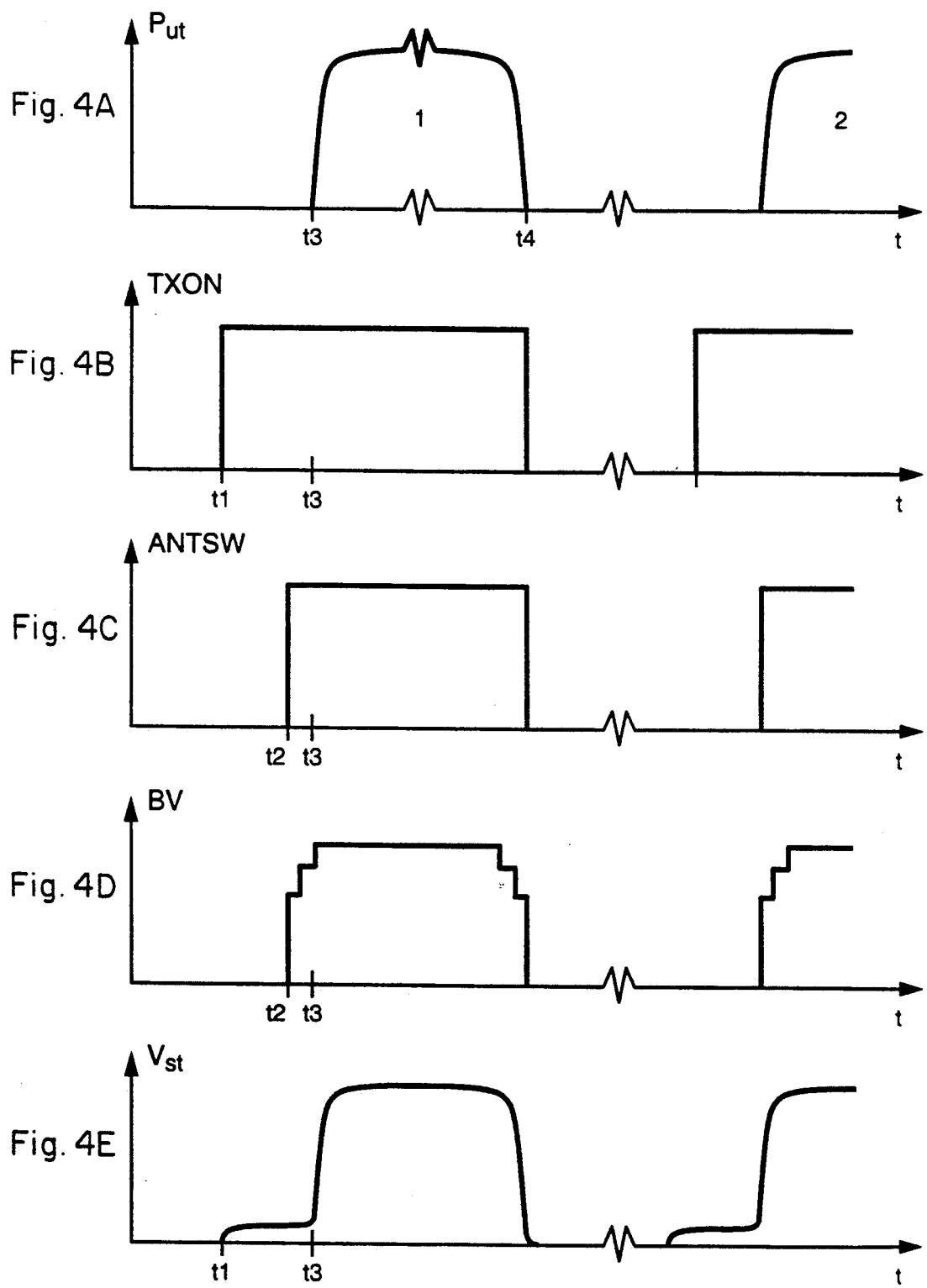

ARRANGEMENT FOR ELIMINATING OFFSET ERRORS IN A POWER CONTROL CIRCUIT OF A PULSED TRANSMITTER FINAL AMPLIFIER

FIELD OF THE INVENTION

The present invention relates to an arrangement for eliminating offset errors in a power control circuit for a pulsed transmitter power amplifier particularly in mobile radio apparatus for TDMA-systems.

BACKGROUND OF THE INVENTION

In a cellular mobile radio system, it is necessary to keep transmitter power to the lowest level possible without impairing signal quality, so as to reduce the risk of interference between neighbouring cells which transmit on mutually the same channels. Transmission quality is therefore measured continuously and the transmitter power is adjusted to one of a number of possible transmitter power levels (for instance 8).

In known mobile telephony systems, for instance the system described in U.S. Pat. No. 4,523,155, which relates to a mobile telephone of the FDMA-type, a base station measures signal quality and sends a signal to the mobile telephone, where the digital signal is converted to an analog signal which represents the set-point value of the desired signal level. A detector measures the power output of the transmitter stage and generates a voltage which represents said power output (the actual or real value). This voltage is compared with the set-point value and a transmitter stage control voltage is generated.

Because of the wide dynamic range of the power output, the detector voltage will vary greatly and at the lowermost transmitter powers will be of the same order of magnitude as the offset voltage normally found in the differential amplifier used in the control circuit as a means for comparing the set-point value with the actual value. Consequently, the control circuit may have difficulty in distinguishing between offset voltage and the detector output signal at very low levels.

SUMMARY OF THE INVENTION

In TDMA-type mobile telephone systems in which the transmitter is switched on intermittently during an allotted time slot, it is particularly important to be able to control the power outputs efficiently down to very low levels, in order to prevent the transmitter from causing spectrum spreading when switched on and off. The error caused by the offset voltage at low levels can therefore not be tolerated and must be compensated for. Hitherto, this compensation has been achieved by circuit trimming in manufacture. Trimming, however, has been found insufficient owing to the fact that the offset voltage is temperature-dependent. Furthermore, trimming is time consuming.

According to the invention, compensation can be achieved readily and in a simple manner at the pulsated transmitter final stage of class C. This is based on the fact that such a transmitter stage has a knee in the power output control voltage characteristic. Shortly before the transmitter is to start, a period for measuring and compensating the offset voltage is introduced. Because this compensation is repeated for each transmitter pulse, any effects caused by temperature are also compensated for.

The invention substantially eliminates offset error in a power control circuit for a pulsed transmitter final amplifier. The power control circuit includes a differential amplifier having a first input which is supplied with a level control signal (BV) occurring over the duration of the transmitter pulses for determining one of a number of possible levels fo the power output of the transmitter final amplifier, a second input which is supplied with a signal (Udet) derived from teh power output, and an output which is connected to a power control input on the transmitter final amplifier. A correction circuit is used to measure the differential amplifier output signal during the pauses between transmitter pulses and to store in a memory (C) a magnitude which represents this output signal. The correction circuit is also used to generate, during the transmitter pulse, a correction voltage (Ukorr) which is controlled by the magnitude stored in the memory and which compensates the offset voltages (Uoff) in the control loop which, in turn, produces an output signal from the differential amplifier despite the absence of a level control signal (BV) and a signal (Udet) derived from the power output.

The correction circuit preferably also includes a charging circuit which is controlled by the differential amplifier output signal. The memory circuit preferably includes a capacitor (C) connected to the charging circuit through a switch which is controlled to be closed during a short time period (from $t_1$ to $t_2$) prior to the transmitter pulses.

The invention also preferably includes a current generator connected to the capacitor (C) and a resistance (R3) connected in the second input of the differential amplifier to establish the correction voltage (Ukorr) across the resistance (R3) directed against the offset voltage (Uoff).

BRIEF DESCRIPTION OF THE DRAWINGS

The invention will now be described in more detail with reference to the accompanying drawings, in which

FIG. 4A–4E are pulse diagrams illustrating a number of signals that can be used for controlling the transmitter part of a typical mobile telephone system according to the GSM standards.

DETAILED DESCRIPTION OF THE PREFERRED EMBODIMENT

Figure 1:
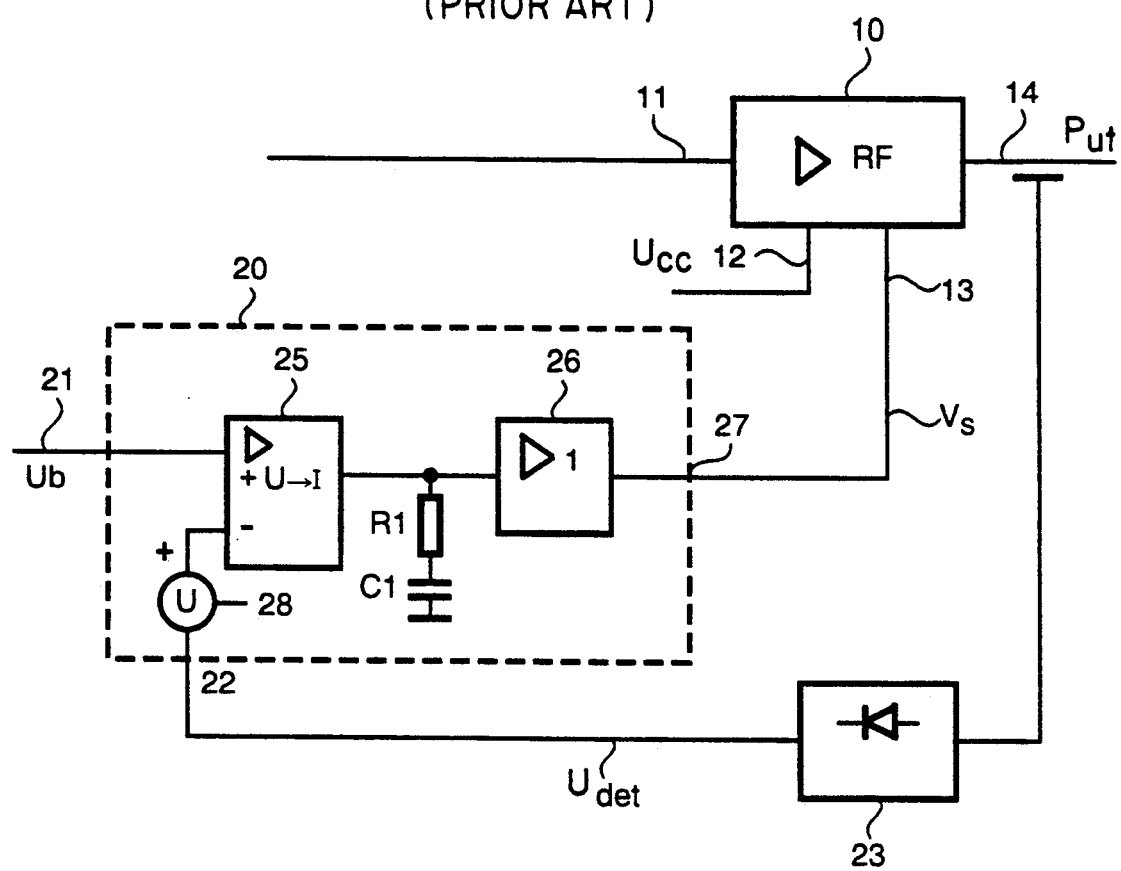
FIG. 1 is a block schematic of a known control system.

FIG. 1 is a block schematic which illustrates a known control stage for a transmitter final stage. Reference 10 identifies a standard power amplifier module of the kind generally used in mobile telephones. The module has an input 11 for a modulated HF-signal that has been generated in an earlier stage in the transmitter part of the mobile telephone, a current supply input 12, a power output control input 13, and an output 14 which is connected to an antenna circuit, not shown.

Reference 20 indicates generally a regulator having an input 21 to which there is applied a set-point or control value Ub generated in a digital/analog converter (not shown) as a function of a digital power control signal. A detector 23 is connected to the power amplifier for the purpose of generating an output signal as a function of the power output of the transmitter final stage and the output of the detector is connected to a second input 22 on the regulator. The regulator includes a differential amplifier 25 whose inputs are connected to the regulator inputs 21 and 22 and whose current source output is connected through a filter R1C1 to a drive circuit 26, the output of which is connected to the regulator output 27. The regulator output is connected in turn to the input 13 of the transmitter final stage. Drawn in the line between the detector output and the regulator input 22 is a voltage generator 28 which symbolizes the offset voltage Uoffs of the differential amplifier 25. It will be evident that the offset voltage Uoffs will be added to the detector voltage. At low power levels, the voltage output of the detector will be of the same order of magnitude as the offset voltage and consequently the power output is liable to deviate from a determined value to an impermissible extent.

Figure 2:
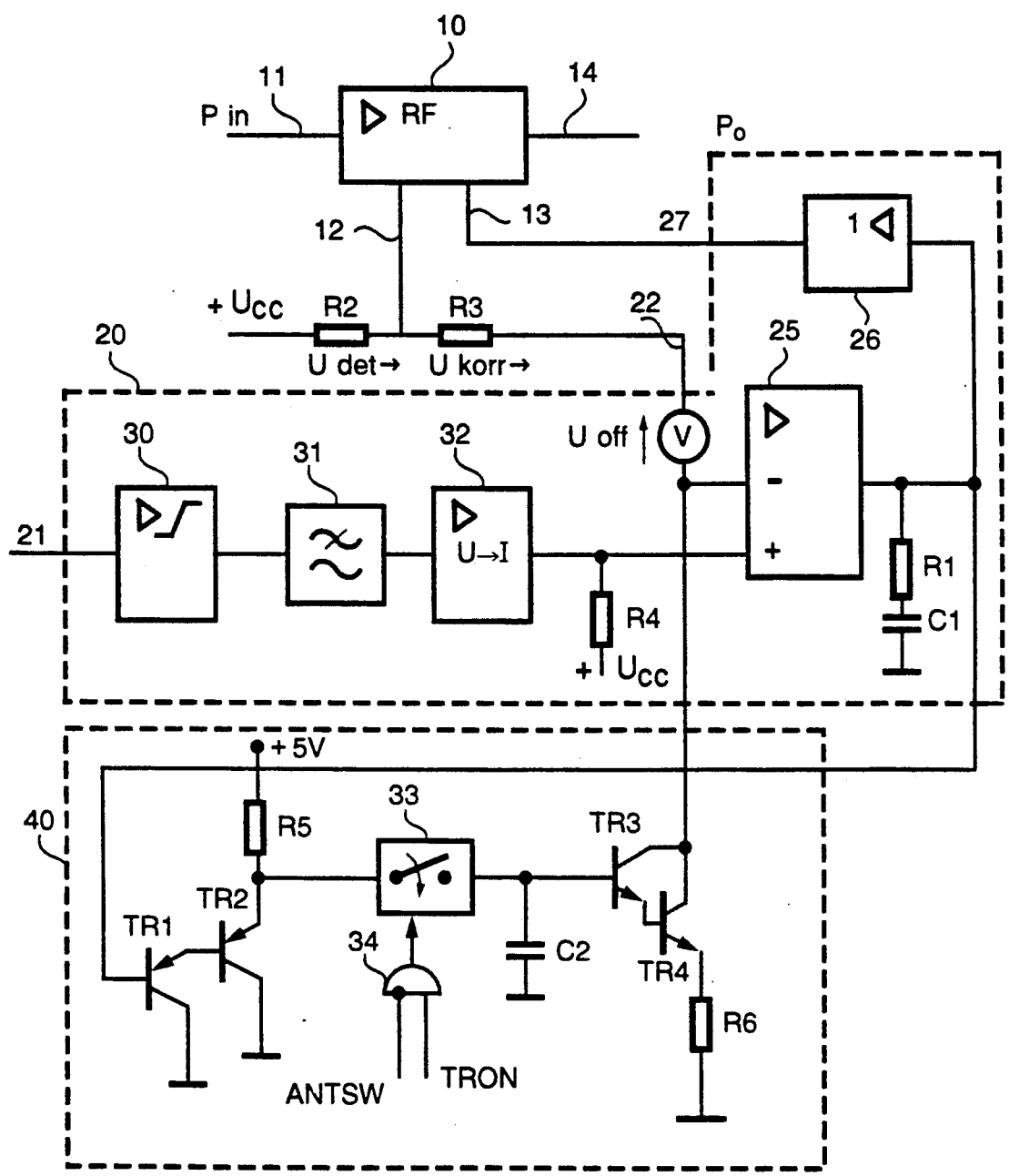
FIG. 2 is a diagram illustrating the principles of an inventive control system.

FIG. 2 is a corresponding block schematic illustrating a preferred embodiment of an inventive control stage. Corresponding details have been identified with corresponding references.

In the FIG. 2 embodiment, the current supply input 12 of the power module 10 is connected to the voltage source Ucc via a small resistance R2 and via the resistance R3 to one input 22 of the regulator 20. The resistance R2, which is relatively small (e.g. 0.1 Ohm) results in a voltage drop which is proportional to the collector current of the transmitter module, this collector current represents the power output Put (or more particularly a non-linear function of Put) with sufficient accuracy. The regulator 22 of the FIG. 2 embodiment has a somewhat different construction than the regulator of the FIG. 1 embodiment. In order to adapt the power control signal on the input 21 to the fact that the signal on the input 22 represents a non-linear function of Put, there is provided a non-linear circuit 30 which is connected to the plus-input of the differential amplifier 25 through a lowpass filter and an amplifier 32 with current output. In order to adapt the level of the signal on this input, the amplifier 32 is supplied from the same voltage source +Ucc as the power module 10.

In addition to being connected to the control input 13 on the power module 10, the output of the differential amplifier 25 is also connected to the input of a correction circuit 40. This correction circuit includes an amplifier TR1, TR2, R5 which is connected to a charging capacitor C2 via a control switch 33. The charging capacitor is connected in turn to the amplifier TR3, TR4, R6 to which current is supplied from Ucc via resistances R2 and R3. The contact 33 is controlled by a gate 34 having a non-inverting and an inverting input to which the signals TRON and ANTSW are respectively applied, as described in more detail herebelow.

Figure 3:
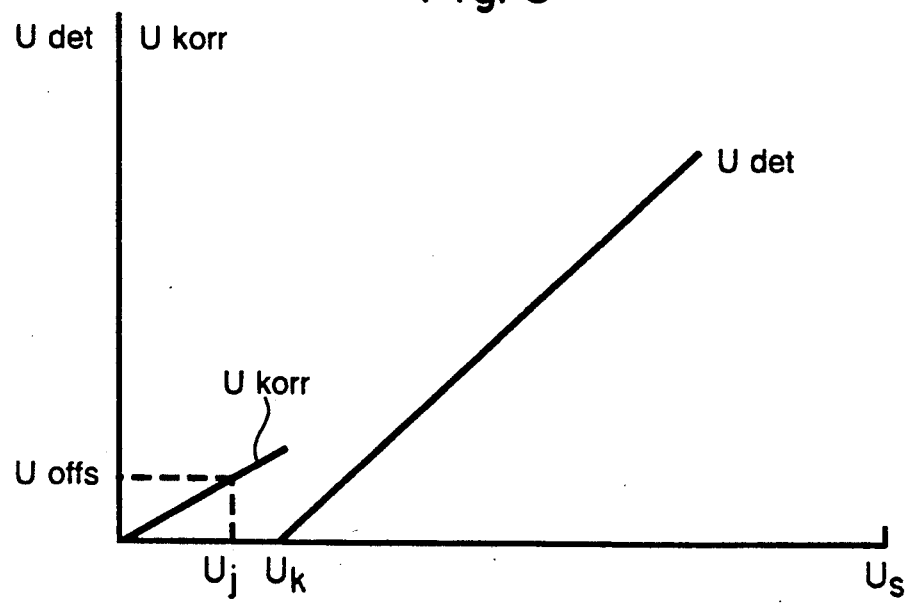
FIG. 3 is a voltage diagram which illustrates compensation of the offset voltage.

The manner in which the inventive arrangement operates will now be described in more detail with reference to FIG. 2 and also with reference to the diagrams of FIGS. 3 and 4. FIG. 4A shows the power output as a function of time. The transmitter starts at time point $t_3$ and then continues to supply the antenna during the time period of the allotted time slot $t_3$ to $t_4$. In the GSM system, the time slot has a length of 580 $\mu s$. The next pulse in this channel arrives after about 4.6 ms. Prior to starting the actual transmitter, a logic signal TXON (FIG. 4B) is generated at time $t_1$ and starts the oscillator in the transmitter, among other things.

The final amplifier, however, is not started in this moment. Instead, the transmitter is activated by a logic signal ANTSW (FIG. 4C) which appears a short time $t_2$ before the transmitter begins to deliver power. The set-point value BV (FIG. 4D) which is intended to control the power output from the transmitter is also obtained at time point $t_2$. At time point $t_1$, the system is at rest between two transmitter pulses. The power control set-point value BV is then zero and since the power output from the final stage is also zero, the regulator output voltage also ought to be zero. However, because of the offset voltage in the regulator 20, the regulator will have a certain voltage on the output 27. This voltage is re-applied to the correction circuit 40 and controls charging of the capacitor C2 to a value Uc through the current switch 33. The switch 33 is closed when the logic signal TXON is on at the same time as the logic signal ANTSW is zero (the transmitter is inactive), but is opened promptly when the logic signal ANTSW appears. The voltage Uc drives a current generator comprised of a Darlington switch TR3, TR4, R6 which draws sufficient current through the resistance R3 to provide a voltage Ukorr across R3 which is sufficient to compensate for the offset voltage Uoffs. The capacitor C2 is sufficiently large to maintain the voltage Uc over the whole of the period from time $t_3$ to $t_4$ when the transmitter is active and the switch 33 is open. The current generator will therefore continue to generate Ukorr=Uoffs during the whole of the time slot in which the transmitter is active.

In the preferred embodiment, the transmitter does not begin to deliver power at low control voltages Us. The power output Put plotted as a function of the control voltage accordingly has a knee. As seen in FIG. 3, the output voltage Udet from the detector 23 will have the corresponding knee in the Udet/Us diagram as the detector voltage Udet follows the power output Put. FIG. 3 shows the detector voltage Udet and the correction voltage Ukorr as a function of the control voltage Us. No voltage Udet should appear until the control voltage Us has reached the knee Uk. The point of equilibrium Uj for the control voltage Us that corresponds to compensation of the offset voltage Uoff is lower than the knee voltage Uk. The preferred embodiment avoids having the power amplifier 10 start to deliver energy during the actual correction sequence. FIG. 4E illustrates the control voltage Us as a function of time. The firts part of the diagram between times $t_1$ and $t_3$ is the time during which the offset is compensated but the control voltage is not sufficient to start the amplifier 10. At the time $t_3$, the control voltage rapidly rises and the power amplifier 10 starts to deliver power on the output 14 as described above. In this preferred embodiment, Uoffs must always have the same polarity. This can readily be achieved with the aid of appropriate leakage circuits when required.

When testing an arrangement according to FIG. 2 with a mobile telephone in the GMS system, it was possible to eliminate offset voltages as high as 5–10 mV. The regulator was able to adjust with good precision a power output whose peak value gave a detector voltage Udet of only 4 mV. Adjustment of the correction voltage could be achieved in about 10 $\mu s$.

However, the regulator was able to regulate parts of millivolts during the up and down ramp of the power pulse Put.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the form of the invention herein shown and described is the presently preferred embodiment. Equivalent elements or materials may be substituted for those illustrated and elements or materials may be substituted for those illustrated and described herein, the configuration of parts may be changed, and certain features of the invention may be utilized independently of the use of other features, all as would be apparent to one skilled in the art after having the benefit of this description of the invention.

I claim:

1. An arrangement for eliminating offset errror in a power control circuit for a pulsed transmitter final amplifier comprising:

a differential amplifier having a first input, a second input and an output,
  said differential amplifier first input being electrically connected to receive a level control signal, said level control signal being provided substantially during transmitter pulses to allow determination of a power output level of said transmitter final amplifier,
  said differential amplifier second input being electrically connected to receive a power output signal, and
  said differential amplifier output being electrically connected to a power control input on said transmitter final amplifier;

a memory circuit to allow storage of a magnitude representing an electrical signal;

a correction circuit electrically connected to measure a signal from said differential amplifier output during pauses between transmitter pulses and store a magnitude representing said differential amplfiier output signal in said memory circuit; and said correction circuit further electrically connected to generate a correction voltage controlled by said stored magnitude during at least one transmitter pulse, wherein said correction voltage is electrically connected to compensate for an offset voltage in the control circuit and produce said differential amplifier output signal despite the absence of said level control signal and said power output signal.

2. The arrangement of claim 1 wherein said correction circuit further comprises a charging circuit responsive to said differential amplifier output signal and said memory circuit further comprises a capacitor connected to the charging circuit through a switching means, said switching means providing a substantially closed circuit path during an interval preceding the transmitter pulses.

3. The arrangement of claim 2 further comprising a current generator electrically connected to said capacitor and electrically connected to provide a resistance to said differential amplifier second input wherein said correction voltage is generated across said resistance and directed against said offset voltage.

* * * * *